(12) United States Patent
Lu et al.

(10) Patent No.: US 10,839,188 B2
(45) Date of Patent: Nov. 17, 2020

(54) FINGERPRINT SENSING PANEL AND FINGERPRINT SENSOR THEREOF

(71) Applicant: Au Optronics Corporation, Hsinchu (TW)

(72) Inventors: Wen-Je Lu, Hsinchu (TW); Yu-Jung Liu, Kaohsiung (TW)

(73) Assignee: Au Optronics Corporation, Hsinchu (TW)

(*) Notice: Subject to any disclaimer, the term of this patent is extended or adjusted under 35 U.S.C. 154(b) by 162 days.

(21) Appl. No.: 16/167,541

(22) Filed: Oct. 23, 2018

(65) Prior Publication Data
US 2019/0311171 A1    Oct. 10, 2019

(30) Foreign Application Priority Data

Apr. 10, 2018   (TW) .............................. 107112331 A

(51) Int. Cl.
| G06K 9/00 | (2006.01) |
| G01R 27/16 | (2006.01) |
| G01K 7/16 | (2006.01) |
| G01B 7/28 | (2006.01) |

(52) U.S. Cl.
CPC ............. G06K 9/0002 (2013.01); G01K 7/16 (2013.01); G06K 9/0008 (2013.01); G01B 7/28 (2013.01); G01R 27/16 (2013.01)

(58) Field of Classification Search
CPC .... G06K 9/0002; G06K 9/0008; G01R 27/16; G01K 7/16; G01B 7/28
USPC ........................ 324/500, 600, 654–661, 200, 324/207.13–207.22, 233–245, 515, 520, 324/521, 529, 530, 750.06, 559, 609
See application file for complete search history.

(56) References Cited

U.S. PATENT DOCUMENTS

| 6,108,438 A | 8/2000 | Bird et al. |
| 6,512,381 B2 | 1/2003 | Kramer |
| 7,406,185 B2 | 7/2008 | Chou et al. |
| 7,720,265 B2 | 5/2010 | Bustgens et al. |
| 7,910,902 B2 | 3/2011 | Dinh |
| 8,724,860 B2 | 5/2014 | Dinh |
| 2005/0281441 A1* | 12/2005 | Martinsen ............ A61B 5/6838 382/124 |

(Continued)

FOREIGN PATENT DOCUMENTS

| CN | 1221213 | 10/2005 |
| CN | 101057249 | 10/2007 |

*Primary Examiner* — Vincent Q Nguyen
*Assistant Examiner* — Trung Nguyen
(74) *Attorney, Agent, or Firm* — JCIPRNET

(57) ABSTRACT

A fingerprint sensing panel and a fingerprint sensor thereof are provided. The fingerprint sensor includes first to third switches, a first capacitor, an impedance variation element and a sensing circuit. The first switch receives a system high voltage and is controlled by a pre-charge signal. The first capacitor is coupled between the first switch and a reference voltage. The impedance variation element is coupled between the first switch and the reference voltage, and an impedance value of the impedance variation element is changed according to a vertical distance between the impedance variation element and a skin surface. The second switch receives the system high voltage. The third switch receives a read signal. The sensing circuit is coupled to the third switch and provides a fingerprint determination voltage.

16 Claims, 3 Drawing Sheets

(56) References Cited

U.S. PATENT DOCUMENTS

2006/0217915 A1 9/2006 Dinh
2007/0046299 A1* 3/2007 Hargreaves ........ G01R 27/2605
 324/678
2008/0063246 A1 3/2008 Dinh

* cited by examiner

FINGERPRINT SENSING PANEL AND FINGERPRINT SENSOR THEREOF

CROSS REFERENCE TO RELATED APPLICATION

This application claims the priority benefit of Taiwan application serial no. 107112331, filed on Apr. 10, 2018. The entirety of the above-mentioned patent application is hereby incorporated by reference herein and made a part of specification.

BACKGROUND OF THE DISCLOSURE

Field of the Disclosure

The disclosure relates to a fingerprint identification technology, and particularly relates to a fingerprint sensing panel and a fingerprint sensor thereof.

Description of Related Art

Current fingerprint identification technology may be generally applied to personal safes, door locks, consumer electronic devices (personal computers, mobile phones, tablet PCs) and so on. At present, the more widely used fingerprint identification technology is mainly optical sensing technology or temperature sensing technology, and as the related technologies mature, the resolution and accuracy of fingerprint identification are further improved. However, how to simplify a circuit when the fingerprint sensor has a certain degree of accuracy and responding speed has become an important issue for the relevant technical persons in the art.

SUMMARY OF THE DISCLOSURE

The disclosure provides a fingerprint sensing panel and a fingerprint sensor thereof, which may simplify a circuit structure of the fingerprint sensor under a certain degree of accuracy and responding speed.

A fingerprint sensor of the disclosure includes first to third switches, a first capacitor, an impedance variation element and a sensing circuit. The first switch has a first end which receives a system high voltage, a control end which receives a pre-charge signal and a second end. The first capacitor is coupled between the second end of the first switch and a reference voltage. The impedance variation element is coupled between the second end of the first switch and the reference voltage, and an impedance value of the impedance variation element is changed according to a vertical distance between the impedance variation element and a skin surface. The second switch has a first end which receives a system high voltage, a control end coupled to the second end of the first switch and a second end. The third switch has a first end coupled to the second end of the second switch, a control end which receive a read signal and a second end. The sensing circuit is coupled to the second end of the third switch and provides a fingerprint determination voltage.

A fingerprint sensing panel of the disclosure includes a plurality of pre-charge control lines, a plurality of read control lines, a plurality of read data lines, a plurality of fingerprint sensors, and a plurality of information read circuits, wherein the plurality of fingerprint sensors include first to third switches, a first capacitor, an impedance variation element and a sensing circuit. The plurality of pre-charge control lines are used to transmit a plurality of sequentially enabled pre-charge signals. The plurality of read control lines are used to transmit a plurality of sequentially enabled read signals. The first switch has a first end which receives a system high voltage, a control end coupled to the corresponding pre-charge control line and a second end. The first capacitor is coupled between the second end of the first switch and a reference voltage. The impedance variation element is coupled between the second end of the first switch and the reference voltage, and an impedance value of the impedance variation element is changed according to a vertical distance between the impedance variation element and a skin surface. The second switch has a first end which receives a system high voltage, a control end coupled to the second end of the first switch and a second end. The third switch has a first end coupled to the second end of the second switch, a control end coupled to the corresponding read control line and a second end. The sensing circuit is coupled to the second end of the third switch and the corresponding read data line, and provides a fingerprint determination voltage to the corresponding read data line. The plurality of information read circuits are respectively coupled to the corresponding read data lines, and determine that the skin surface sensed by each of the fingerprint sensors are valley lines or ridge lines of a fingerprint according to the fingerprint determination voltage transmitted by the corresponding read data lines, thereby providing fingerprint-related signals corresponding to each of the fingerprint sensors.

Based on the foregoing, the impedance variation element in the fingerprint sensor of the exemplary embodiment of the disclosure may change or adjust the impedance value of the impedance variation element according to the vertical distance between the impedance variation element and the skin surface on the finger of the user, thereby determining a discharge time between the first capacitor and the impedance variation element. In this way, the exemplary embodiment may identify the valley lines and the ridge lines of the fingerprint according to the changes in the impedance value of the impedance variation element. Therefore, the circuit structure of the fingerprint sensor may be simplified with a certain degree of accuracy and responding speed.

To make the above features and advantages of the disclosure more comprehensible, embodiments accompanied with drawings are described in detail as follows.

DETAILED DESCRIPTION OF DISCLOSED EMBODIMENTS

Figure 1:
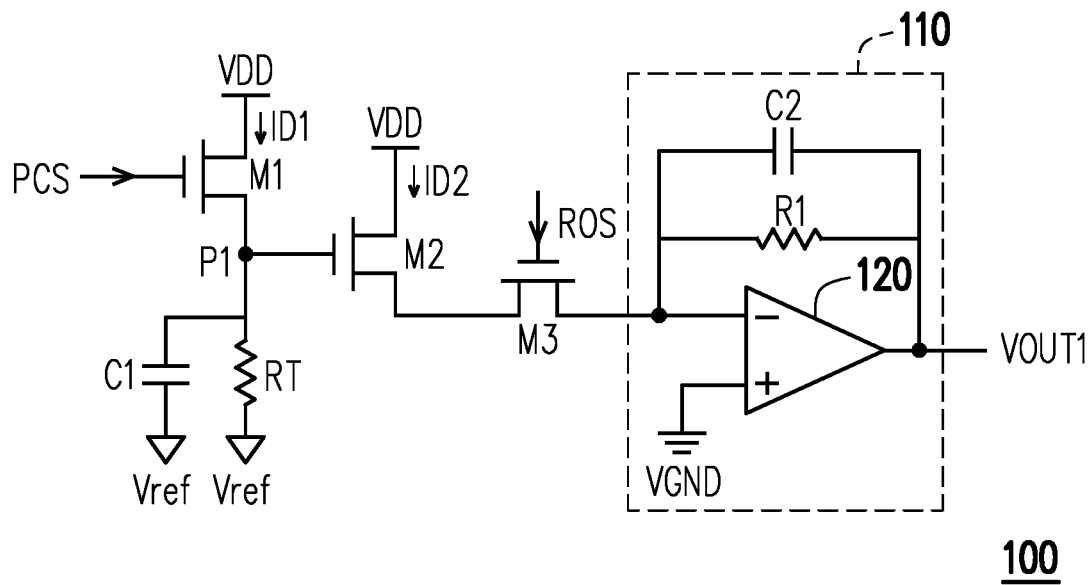
FIG. 1 is a circuit diagram of a fingerprint sensor according to an exemplary embodiment of the disclosure.

FIG. 1 is a circuit diagram of a fingerprint sensor 100 according to an exemplary embodiment of the disclosure. Referring to FIG. 1, in the exemplary embodiment, the fingerprint sensor 100 includes first to third switches M1 to M3, a first capacitor C1, an impedance variation element RT and a sensing circuit 110, wherein the first to third switches M1 to M3 of the exemplary embodiment are exemplified as transistors, and the impedance variation element RT is exemplified as a thermal-sensitive impedance element, but the disclosure is not limited thereto.

In the exemplary embodiment, a drain (corresponding to a first end) of the first switch M1 receives a system high voltage VDD, a gate (corresponding to a control end) of the first switch M1 receives a pre-charge signal PCS, a source (corresponding to a second end) of the first switch M1 is coupled to a node P1. The first capacitor C1 is coupled between the node P1 and a reference voltage Vref. The impedance variation element RT is coupled between the node P1 and the reference voltage Vref. A drain (corresponding to the first end) of the second switch M2 receives the system high voltage VDD, and a gate (corresponding to the control end) of the second switch M2 is coupled to the node P1. A drain (corresponding to the first end) of the third switch M3 is coupled to a source (corresponding to the second end) of the second switch M2, and a gate (corresponding to the control end) of the third switch M3 receives a read signal ROS. The sensing circuit 110 is coupled to a source (corresponding to the second end) of the third switch M3, and the sensing circuit 110 may provide a fingerprint determination voltage VOUT1.

The sensing circuit 110 of the exemplary embodiment includes a first operational amplifier 120, a first resistor R1 and a second capacitor C2. Specifically, in the exemplary embodiment, an inverting input terminal (corresponding to a first input terminal) of the first operational amplifier 120 is coupled to a second end of the third switch M3, a positive input terminal (corresponding to a second input terminal) of the first operational amplifier 120 receives a ground voltage VGND, and an output terminal of the first operational amplifier 120 may provide the fingerprint determination voltage VOUT1. On the other hand, the first resistor R1 is coupled between the first input terminal of the first operational amplifier 120 and the output terminal of the first operational amplifier 120. Also, the second capacitor C2 is coupled between the first input terminal of the first operational amplifier 120 and the output terminal of the first operational amplifier 120, wherein the sensing circuit 110 of the exemplary embodiment is in the form of a current sensing circuit, but the exemplary embodiment of the disclosure is not limited thereto.

Specifically, when a user carries out a touching or pressing action on a touch surface of the fingerprint sensor 100 through a touch medium (for example, a finger), the fingerprint sensor 100 will turn on or turn off the first switch M1, the second switch M2, and the third switch M3 according to timing states of the pre-charge signal PCS and the read signal ROS, thereby determining a voltage value of the fingerprint determination voltage VOUT1. In addition, the impedance variation element RT of the exemplary embodiment changes or adjusts an impedance value of the impedance variation element RT according to a vertical distance between the impedance variation element RT and a skin surface on the user's finger.

Further, when a voltage value on the node P1 is sufficient to turn on the second switch M2, the voltage value of the fingerprint determination voltage VOUT1 increases, and charges of the first capacitor C1 performs discharging through the impedance variation element RT. Also, since the impedance value of the impedance variation element RT is changed according to the vertical distance between the impedance variation element RT and the skin surface on the user's finger, a discharge time of the first capacitor C1 is changed correspondingly. Based on the above, the fingerprint determination voltage VOUT1 of the exemplary embodiment determines a rising level of the fingerprint determination voltage VOUT1 according to a discharge time between the above first capacitor C1 and the impedance variation element RT. Next, the fingerprint determination voltage VOUT1 of the exemplary embodiment may be compared with a threshold voltage to determine the result of whether a fingerprint of a skin surface of the user's finger sensed by the fingerprint sensor 100 is a valley line or ridge line. In this way, the exemplary embodiment may identify the valley lines and the ridge lines on the fingerprint according to the change in the impedance value of the impedance variation element RT. Therefore, a circuit structure of the fingerprint sensor may be simplified with a certain degree of accuracy and responding speed.

Figure 2:
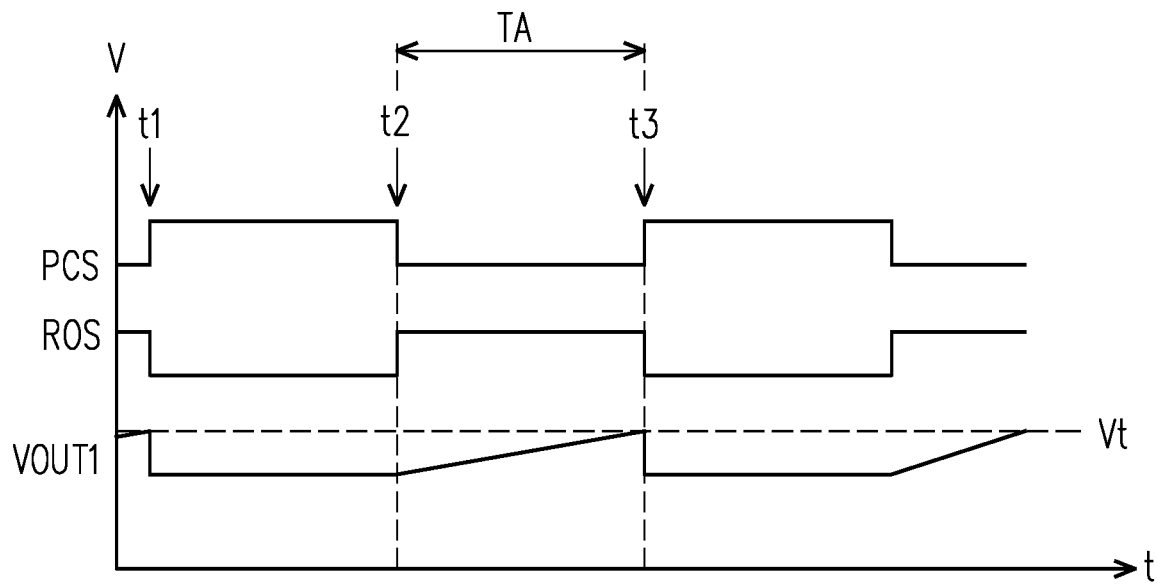
FIG. 2 is a waveform diagram of a fingerprint sensor according to an exemplary embodiment of the disclosure.

FIG. 2 is a waveform diagram of a fingerprint sensor according to an exemplary embodiment of the disclosure. Referring to FIG. 1 and FIG. 2 at the same time, specifically, when the fingerprint sensor 100 operates at a time point t1, the pre-charge signal PCS may be set as an enabled (for example, high voltage level) state, and the read signal ROS may be set as a disabled (for example, low voltage level) state. At the same time, the first transistor M1 and the second transistor M2 may be turned on, and the third transistor M3 may be turned off. In addition, the voltage value on the node P1 may be set as a voltage value of the system high voltage VDD, and the voltage value of the fingerprint determination voltage VOUT1 may be set as a voltage value of the ground voltage VGND. It is worth mentioning that when the first transistor M1 is turned on, a conductive current ID1 may perform a charging action on the first capacitor C1 so that the voltage value on the first capacitor C1 may be charged to the system high voltage VDD (that is, the voltage value on the node P1 is the system high voltage VDD).

Next, when the fingerprint sensor 100 operates at a time point t2 after the time point t1, the pre-charge signal PCS may be set as a disabled (for example, low voltage level) state, and the read signal ROS may be set as an enabled (for example, high voltage level) state. At the same time, the first transistor M1 may be turned off, and the second transistor M2 and the third transistor M3 may be turned on. Specifically, in a time interval TA between the time point t2 and a time point t3, the first capacitor C1 performs a discharging action through the impedance variation element RT. At this time, a voltage value VP1 on the node P1 may be as shown in the following equation:

$$VP1=((VDD \times C1)-(VDD/RT) \times T)/C1=1-T/(RT \times C1)$$

wherein, the above VP1 is the voltage value on the node P1; the VDD is the voltage value of the system high voltage VDD; the C1 is a capacitance of the first capacitor C1; the RT is a resistance of the impedance variation element RT; and the T is time.

According to the above equation, it may be learnt that a coefficient value of a resistance-capacitance delay (RC delay) between the impedance variable element RT and the first capacitor C1 of the exemplary embodiment is in negative correlation with a decrease level of the voltage value VP1 on the node P1. For example, when the coefficient value of the RC delay between the impedance variation element RT and the first capacitor C1 is smaller, the voltage value VP1 on the node P1 drops faster so that the second transistor M2 has a shorter conductive time, thereby enabling the second transistor M2 to provide a conductive current ID2 of shorter time to the sensing circuit 110. In this way, at the time interval TA, the voltage value of the fingerprint determination voltage VOUT1 does not have sufficient time to rise to a threshold voltage Vt. In contrast, when the coefficient value of the RC delay between the impedance variation element RT and the first capacitor C1 is larger, the voltage value VP1 on the node P1 drops more slowly so that the second transistor M2 has a longer conductive time, thereby enabling the second transistor M2 to provide a conductive current ID2 of longer time to the sensing circuit 110. In this way, at the time interval TA, the voltage value of the fingerprint determination voltage VOUT1 has sufficient time to rise to the threshold voltage Vt. In other words, in the exemplary embodiment, the impedance value of the impedance variation element RT may change or adjust according to the vertical distance between the impedance variation element RT and the user's skin surface, thereby determining whether the voltage value of the fingerprint determination voltage VOUT1 rises to the threshold voltage Vt.

Moreover, the fingerprint sensor 100 of the exemplary embodiment may also determine whether the fingerprint of the skin surface sensed by the fingerprint sensor 100 is a valley line or a ridge line through a result of the fingerprint determination voltage VOUT1 output by the sensing circuit 110. For example, assuming that the impedance value of the impedance variation element RT is proportional to the vertical distance between the impedance variation element RT and the user's skin surface, if the fingerprint determination voltage VOUT1 may reach the threshold voltage Vt (may be regarded as a logic high level 1), then the fingerprint determination voltage VOUT1 indicates the valley lines of the fingerprint. Relatively, if the fingerprint determination voltage VOUT1 does not reach the threshold voltage Vt (may be regarded as a logic low level 0), then the fingerprint determination voltage VOUT1 indicates the ridge lines of the fingerprint. Alternatively, assuming that the impedance value of the impedance variation element RT is inversely proportional to vertical distance between the impedance variation element RT and the user's skin surface, if the fingerprint determination voltage VOUT1 may reach the threshold voltage Vt, then the fingerprint determination voltage VOUT1 indicates the ridge lines of the fingerprint. Relatively, if the fingerprint determination voltage VOUT1 does not reach the threshold voltage Vt, then the fingerprint determination voltage VOUT1 indicates the valley lines of the fingerprint. Based on the above, the fingerprint sensor 100 of the exemplary embodiment may determine that the above logic high level and the logic low level respectively represent the fingerprint of the skin surface sensed by the fingerprint sensor 100 is a valley line or a ridge line depending on the category or type of the impedance variation element RT, and the disclosure provides no particular limitation thereto.

In the exemplary embodiment, the pre-charge signal PCS is enabled before the read signal ROS is enabled, and the enabling period of the pre-charge signal PCS and the enabling period of the read signal ROS do not overlap each other, but the disclosure is not limited thereto.

Figure 3:
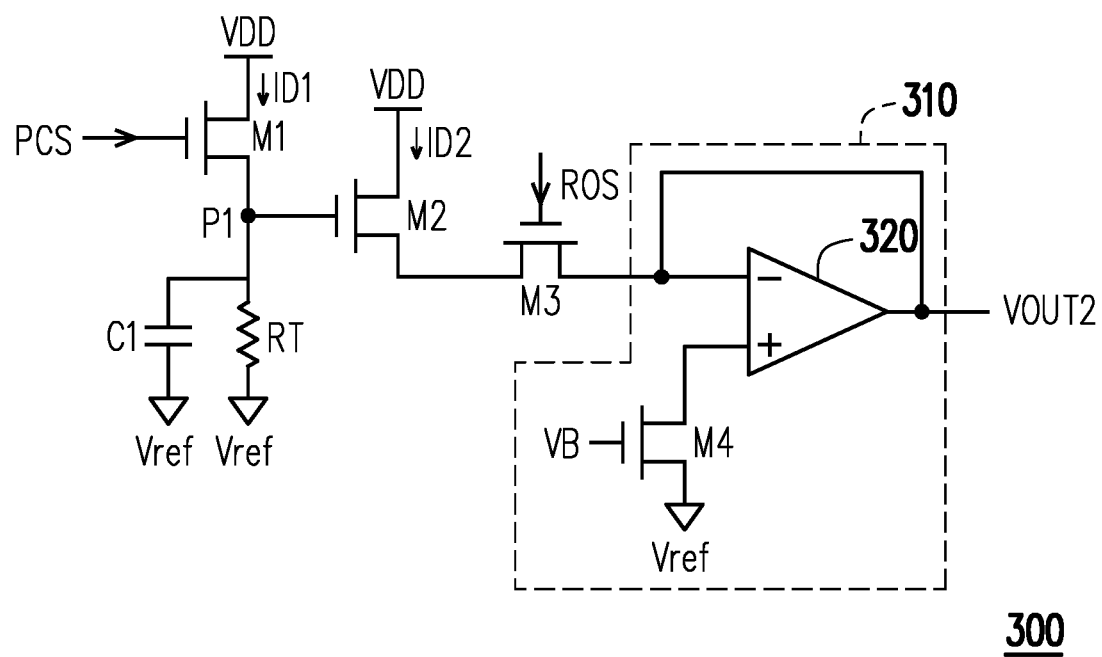
FIG. 3 is a circuit diagram of a fingerprint sensor according to another exemplary embodiment of the disclosure.

FIG. 3 is a circuit diagram of a fingerprint sensor 300 according to another exemplary embodiment of the disclosure. Referring to FIG. 1 and FIG. 3 at the same time, the fingerprint sensor 300 is substantially the same as the fingerprint sensor 100, wherein the difference lies in a sensing circuit 310. In the exemplary embodiment, the sensing circuit 310 may include a second operational amplifier 320 and a fourth switch M4, wherein the same or similar elements are represented by the same or similar reference numerals.

Specifically, in the exemplary embodiment, an inverting input terminal (corresponding to the first input terminal) of the second operational amplifier 320 is coupled to an output terminal of the second operational amplifier 320, a positive input terminal (corresponding to the second input terminal) of the second operational amplifier 320 is coupled to the second end of the third switch M3. Also, the output terminal of the second operational amplifier 320 may provide a fingerprint determination voltage VOUT2. It is worth mentioning that the sensing circuit 310 of the exemplary embodiment is in the form of a voltage sensing circuit (for example, a voltage follower), but the exemplary embodiment of the disclosure is not limited thereto.

On the other hand, in the exemplary embodiment, a drain (corresponding to the first end) of the fourth switch M4 is coupled to the second end of the third switch M3, a gate (corresponding to the control end) of the fourth switch M4 receives a bias voltage VB, a source (corresponding to the second end) of the fourth switch M4 receives a reference voltage Vref. It should be noted that all the operational details relating to the fingerprint sensor 300 are similar to the operational method of the foregoing exemplary embodiment, and both the foregoing exemplary embodiment and implementation method are described in detail and shall not be repeated hereinafter.

Figure 4:
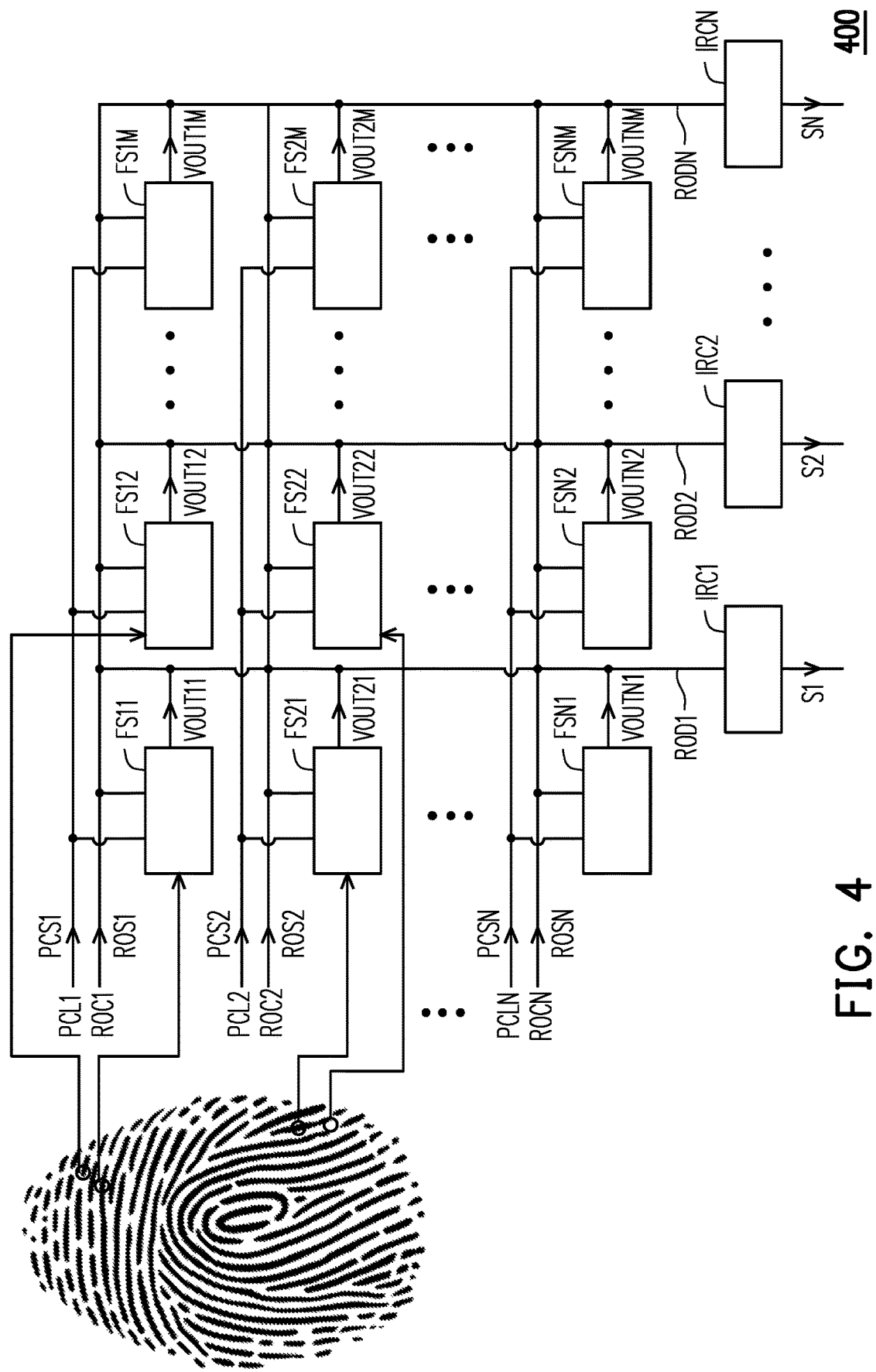
FIG. 4 is a block diagram of a fingerprint sensing panel according to an exemplary embodiment of the disclosure.

FIG. 4 is a block diagram of a fingerprint sensing panel 400 according to an exemplary embodiment of the disclosure. Referring to FIG. 4, in the exemplary embodiment, the fingerprint sensing panel 400 includes a plurality of pre-charge control lines PCL1 to PCLN, a plurality of read control lines ROC1 to ROCN, a plurality of read data lines ROD1 to RODN, a plurality of fingerprint sensors FS11 to FSNM, and a plurality of information read circuits IRC1 to IRCN. Specifically, the plurality of pre-charge control lines PCL1 to PCLN are respectively used for transmitting a plurality of sequentially enabled (for example, high voltage level) pre-charge signals PCS1 to PCSN to a plurality of corresponding fingerprint sensors FS11 to FSNM. In addition, the plurality of read control lines ROC1 to ROCN are respectively used for transmitting a plurality of sequentially enabled (for example, high voltage level) read signals ROS1 to ROSN to a plurality of corresponding fingerprint sensors FS11 to FSNM. For example, the pre-charge control line PCL1 and the read control line ROC1 may respectively transmit the pre-charge signal PCS1 and a read signal ROS1 which are sequentially enabled (for example, high voltage level) to the corresponding fingerprint sensors FS11, FS12, . . . FS1M. Also, the pre-charge control line PCL2 and the read control line ROC2 may respectively transmit the pre-charge signal PCS2 and the read signal ROS2 which are sequentially enabled (for example, high voltage level) to the corresponding fingerprint sensors FS21, FS22, . . . FS2M, and the rest so on and so forth.

On the other hand, the plurality of information read circuits IRC1 to IRCN of the exemplary embodiment are respectively coupled to the corresponding read data lines ROD1 to RODN, and each of the read data lines ROD1 to RODN may respectively receive fingerprint determination voltages VOUT11 to VOUTNM provided by each of the corresponding fingerprint sensors FS11 to FSNM. In this way, each of the information read circuits IRC1 to IRCN may respectively determine whether the skin surface sensed by each of the fingerprint sensors FS11 to FSNM is a valley line or a ridge line of the fingerprint according to the fingerprint determination voltages VOUT11 to VOUTNM transmitted by the corresponding read data lines ROD1 to RODN. In addition, each of the information read circuits IRC1 to IRCN may respectively provide fingerprint-related signals S1 to SN corresponding to each of the fingerprint sensors FS11 to FSNM according to the determination result, wherein the above N and M are positive integers.

In the exemplary embodiment, the fingerprint sensor FS11 and the fingerprint sensor FS12, for example, are configured for sensing valley lines of fingerprints, and the fingerprint sensor FS21 and the fingerprint sensor FS22, for example, are configured for sensing ridge lines of fingerprints, but the disclosure is not limited thereto. Therefore, in the exemplary embodiment, the resistance value of the impedance variation element RT in the fingerprint sensor FS11 and the fingerprint sensor FS12 are relatively similar, and the resistance value of the impedance variation element RT in the fingerprint sensor FS21 and the fingerprint sensor FS22 are relatively similar. The resistance value of the impedance variation element RT in the fingerprint sensor FS11 and the fingerprint sensor FS12 are relatively far from the resistance value of the impedance variation element RT in the fingerprint sensor FS21 and the fingerprint sensor FS22.

In other words, if the resistance value of the impedance variation element RT in the fingerprint sensor FS11 and the fingerprint sensor FS12 falls within a first resistance interval higher than a reference threshold value, then the resistance value of the impedance variation element RT in the fingerprint sensor FS21 and the fingerprint sensor FS22 falls within a second resistance interval lower than the reference threshold value, and vice versa.

It should be noted that the plurality of fingerprint sensors FS11 to FSNM in the exemplary embodiment may be respectively implemented according to the fingerprint sensors (for example, 100 and 300) in the foregoing exemplary embodiments, and the foregoing exemplary embodiments and implementation methods also have detailed descriptions which shall not be repeated hereinafter.

In the foregoing exemplary embodiment, the fingerprint sensor 100 or 300 has a sensing circuit (for example, 110 and 310). However, in other exemplary embodiments, the sensing circuit (for example, 110 and 310) may be configured in the information read circuits IRC1 to IRCN, and the fingerprint sensors FS11 to FSNM have other elements shown in the fingerprint sensor 100 or 300, thereby simplifying the circuit structure of the fingerprint sensors FS11 to FSNM.

In summary of the foregoing, the foregoing impedance variation element in the fingerprint sensor of the disclosure may change or adjust the impedance value of the impedance variation element according to the vertical distance between the impedance variation element and the skin surface of the user's finger, and then determine the discharge time between the first capacitor and the impedance variation element. In addition, the sensing circuit in the fingerprint sensor may determine whether the fingerprint determination voltage reaches a standard threshold voltage, thereby deciding an output of the determination result of whether the fingerprint on the skin surface of the user's finger sensed by the fingerprint sensor is a valley line or a ridge line. In this way, the exemplary embodiment may identify the ridge lines and the valley lines on the fingerprint according to the changes in the impedance value of the impedance variation element. Therefore, the circuit structure of the fingerprint sensor may be simplified under a certain degree of accuracy and responding speed.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A fingerprint sensor, comprising:
    a first switch having a first end receiving a system high voltage, a control end receiving a pre-charge signal and a second end, wherein a connection between the first and the second ends of the first switch is controlled by the control end of the first switch;
    a first capacitor coupled between the second end of the first switch and a reference voltage;
    an impedance variation element coupled between the second end of the first switch and the reference voltage, wherein an impedance value of the impedance variation element is changed according to a vertical distance between the impedance variation element and a skin surface, wherein the first capacitor is discharged through the impedance variation element and provide a discharge signal to the second end of the first switch, the discharge signal corresponds to the impedance value;
    a second switch having a first end receiving the system high voltage, a control end coupled to the second end of the first switch and to receive the discharge signal a second end, wherein a connection between the first and the second ends of the second switch is controlled by the control end of the second switch;
    a third switch having a first end coupled to the second end of the second switch, a control end receiving a read signal and a second end; and
    a sensing circuit having an input end coupled to the second end of the third switch, and an output end providing a fingerprint determination voltage.

2. The fingerprint sensor according to claim 1, wherein the impedance variation element comprises a thermal-sensitive impedance element.

3. The fingerprint sensor according to claim 1, wherein the sensing circuit is a current sensing circuit.

4. The fingerprint sensor according to claim 3, wherein the sensing circuit comprises:
    a first operational amplifier having a first input terminal, a second input terminal receiving a ground voltage and an output terminal providing the fingerprint determination voltage;
    a first resistance coupled between the first input terminal of the first operational amplifier and the output terminal of the first operational amplifier; and
    a second capacitor coupled between the first input terminal of the first operational amplifier and the output terminal of the first operational amplifier.

5. The fingerprint sensor according to claim 1, wherein the sensing circuit is a voltage sensing circuit.

6. The fingerprint sensor according to claim 5, wherein the sensing circuit comprises:
    a second operational amplifier having a first input terminal, a second input terminal coupled to the second end of the third switch and an output terminal providing the fingerprint determination voltage, wherein the second input terminal of the second operational amplifier is coupled to the output terminal of the second operational amplifier; and
    a fourth switch having a first end coupled to the first input terminal of the second operational amplifier, a control end receiving a bias voltage and a second end receiving the reference voltage.

7. The fingerprint sensor according to claim 1, wherein the pre-charge signal is enabled before the read signal is enabled.

8. The fingerprint sensor according to claim 7, wherein an enabling period of the pre-charge signal and an enabling period of the read signal do not overlap each other.

9. A fingerprint sensing panel, comprising:
a plurality of pre-charge control lines used to transmit a plurality of sequentially enabled pre-charge signals;
a plurality of read control lines used to transmit a plurality of sequentially enabled read signals;
a plurality of read data lines;
a plurality of fingerprint sensors, respectively comprising:
- a first switch having a first end receiving a system high voltage, a control end coupled to the corresponding pre-charge control line and a second end, wherein a connection between the first and the second ends of the first switch is controlled by the control end of the first switch;
- a first capacitor coupled between the second end of the first switch and a reference voltage;
- an impedance variation element coupled between the second end of the first switch and the reference voltage, wherein an impedance value of the impedance variation element is changed according to a vertical distance between the impedance variation element and a skin surface, wherein the first capacitor is discharged through the impedance variation element and provide a discharge signal to the second end of the first switch, the discharge signal corresponds to the impedance value;
- a second switch having a first end receiving the system high voltage, a control end coupled to the second end of the first switch to receive the discharge signal and a second end, wherein a connection between the first and the second ends of the second switch is controlled by the control end of the second switch;
- a third switch having a first end coupled to the second end of the second switch, a control end coupled to the corresponding read control line and a second end; and
- a sensing circuit having an input end coupled to the second end of the third switch and a corresponding read data line, and an output end providing a fingerprint determination voltage to the corresponding read data line; and
a plurality of information read circuits, respectively coupled to the corresponding read data line, and determining whether the skin surface sensed by each of the fingerprint sensors is a valley line or a ridge line of a fingerprint according to the fingerprint determination voltage transmitted by the corresponding read data line, thereby providing a fingerprint-related signal corresponding to each of the fingerprint sensors.

10. The fingerprint sensing panel according to claim 9, wherein the impedance variation element comprises a thermal-sensitive impedance element.

11. The fingerprint sensing panel according to claim 9, wherein the sensing circuit is a current sensing circuit.

12. The fingerprint sensing panel according to claim 11, wherein the sensing circuit comprises:
a first operational amplifier having a first input terminal, a second input terminal receiving a ground voltage and an output terminal providing the fingerprint determination voltage;
a first resistor coupled between the first input terminal of the first operational amplifier and the output terminal of the first operational amplifier; and
a second capacitor coupled between the first input terminal of the first operational amplifier and the output terminal of the first operational amplifier.

13. The fingerprint sensing panel according to claim 9, wherein the sensing circuit is a voltage sensing circuit.

14. The fingerprint sensing panel according to claim 13, wherein the sensing circuit comprises:
a second operational amplifier having a first input terminal, a second input terminal coupled to the second end of the third switch, and an output terminal providing the fingerprint determination voltage, wherein the second input terminal of the second operational amplifier is coupled to the output terminal of the second operational amplifier; and
a fourth switch having a first end coupled to the first input terminal of the second operational amplifier, a control end receiving a bias voltage, and a second end receiving the reference voltage.

15. The fingerprint sensing panel according to claim 9, wherein the pre-charge signal received by each of the fingerprint sensors is enabled before the read signal received by each of the fingerprint sensors is enabled.

16. The fingerprint sensing panel according to claim 15, wherein an enabling period of the pre-charge signals and an enabling period of the read signals do not overlap each other.

* * * * *